United States Patent
Brederlow

(10) Patent No.: US 7,031,691 B2
(45) Date of Patent: Apr. 18, 2006

(54) LOW-NOISE AMPLIFIER CIRCUIT AND A METHOD FOR AMPLIFYING LOW-POWER SIGNALS IN A LOW-NOISE MANNER

(75) Inventor: Ralf Brederlow, Munich (DE)

(73) Assignee: Infineon Technologies AG, (DE)

( * ) Notice: Subject to any disclaimer, the term of this patent is extended or adjusted under 35 U.S.C. 154(b) by 370 days.

(21) Appl. No.: 10/181,208

(22) PCT Filed: Jan. 8, 2001

(86) PCT No.: PCT/DE01/00035

§ 371 (c)(1), (2), (4) Date: Sep. 17, 2002

(87) PCT Pub. No.: WO01/52406

PCT Pub. Date: Jul. 19, 2001

(65) Prior Publication Data

US 2003/0076162 A1    Apr. 24, 2003

(30) Foreign Application Priority Data

Jan. 13, 2000    (DE) ................ 100 01 123

(51) Int. Cl.
    *H04B 1/16*    (2006.01)
(52) U.S. Cl. .......... 455/341; 455/253.2; 455/144
(58) Field of Classification Search ........... 455/341, 455/334, 130, 309, 34, 253.2, 194.2, 144; 330/124 R, 84, 69, 295
See application file for complete search history.

(56) References Cited

U.S. PATENT DOCUMENTS

| | | | |
|---|---|---|---|
| 3,587,915 A | 6/1971 | Theobald et al. | |
| 3,699,461 A | 10/1972 | Huntsinger | |
| 3,700,876 A | 10/1972 | Gray | |
| 5,347,355 A * | 9/1994 | Eguchi | 356/494 |
| 6,038,460 A * | 3/2000 | Aleiner | 455/571 |
| 6,069,525 A * | 5/2000 | Sevic et al. | 330/51 |
| 6,278,329 B1* | 8/2001 | Palmisano et al. | 330/302 |
| 6,288,609 B1* | 9/2001 | Brueske et al. | 330/129 |
| 6,697,611 B1* | 2/2004 | Franca-Neto | 455/296 |
| 6,798,294 B1* | 9/2004 | Kuiri | 330/295 |
| 6,801,089 B1* | 10/2004 | Costa et al. | 330/278 |
| 2003/0186669 A1* | 10/2003 | Yamawaki et al. | 455/323 |

FOREIGN PATENT DOCUMENTS

DE    39 42 959 C2    4/1991

OTHER PUBLICATIONS

Muller, Rudolf, Rauschen, Chapter 9, Springer Verlag, Berllin, 1990.

I.N. Bronstein, K.A. Semendjajew, Taschenbuch der Mathematik, p. 603, Verlag Harry Deutsch, Thun 1989.

H. Ott, Noise reduction techniques in electronic systems, Chapter 9, J. Wiley & Sons, NY, 1988.

*Primary Examiner*—Sonny Trinh
(74) *Attorney, Agent, or Firm*—Altera Law Group, LLC; Jeffrey R. Stone \* cited by examiner

(57) ABSTRACT

The invention relates to a low-noise amplifier circuit and a method for amplifying low-power signals in a low-noise manner. Said signals are supplied to the inputs of several amplifiers (20 . . . 29) which are arranged in parallel. The output signals of said amplifiers (20 . . . 29) are multiplied by each other.

5 Claims, 1 Drawing Sheet

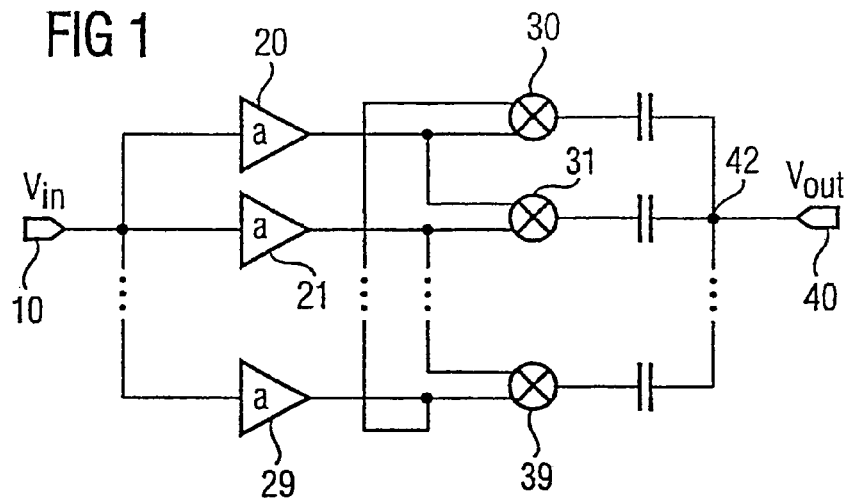
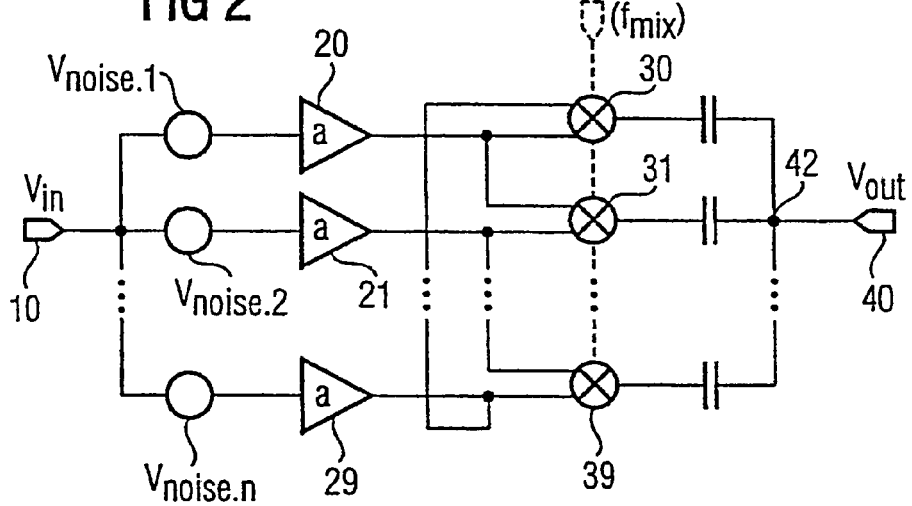
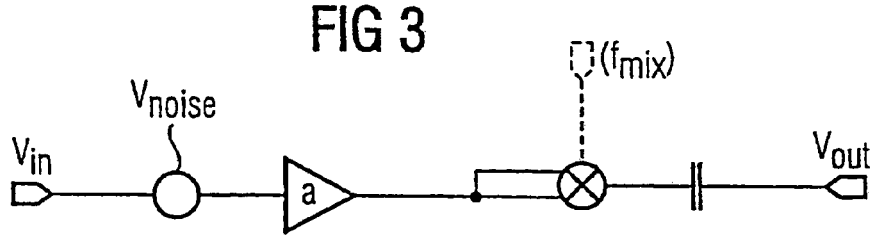

LOW-NOISE AMPLIFIER CIRCUIT AND A METHOD FOR AMPLIFYING LOW-POWER SIGNALS IN A LOW-NOISE MANNER

FIELD OF THE INVENTION

The invention relates to a low-noise amplifier circuit and a method for amplifying low-power signals in a low-noise manner.

BACKGROUND OF THE INVENTION

In signal transmission (in mobile radio or in space travel), it is frequently necessary to detect small signals at the receiver end. The limit for resolving small signals is mostly determined by the noise of the first amplifier stage, and can hardly be influenced.

DESCRIPTION OF THE RELATED PRIOR ART

In the prior art, physical noise has been regarded as a fixed limit which can be slightly influenced only by skillful selection of the operating points of the circuit and the technology used.

Furthermore, DE 39 42 959 C2 describes an amplifier circuit having an input and an output. The input is branched onto the inputs of two amplifiers arranged in parallel. The outputs of multipliers are led to a joint summing point at which the output signal of the amplifier circuit is present.

BRIEF SUMMARY OF THE INVENTION

It is the object of the present invention to be able to amplify signals of even lower power from the noise, that is to say to shift the limit of resolution to even lower signal levels.

According to the invention, this object is achieved by means of a low-noise amplifier circuit having an input and an output, the input being branched onto the inputs of at least two amplifiers arranged in parallel, and the outputs of these amplifiers being respectively connected to two multipliers having two inputs, whose respective other inputs are respectively connected to the output of another amplifier, and the outputs of the multipliers being led to a common summing point at whose output the output signal of the amplifier circuit is present.

The multipliers can in this case preferably simultaneously be designed as frequency mixers. In most instances of such processing, specifically, there is also always a need for frequency mixing for demodulation.

Furthermore, the object according to the invention is achieved by means of a method for low-noise amplification of low-power signals, in which these signals are fed to the inputs of a plurality of amplifiers arranged in parallel, and the output signals of these amplifiers are multiplied by one another.

The multiplication can preferably be performed jointly with frequency mixing.

It is particularly preferred in this case when the output signals of the amplifiers are respectively multiplied by one another in pairs, and the results of the multiplication are then summed and the output signal is thus formed.

In the case of particularly unfavorable signal-to-noise ratios, according to the invention the signals can be transmitted repeatedly, and the mean value can be formed from the repeatedly transmitted signals.

Such a solution was previously not known from the prior art. The correlation of signals was certainly already utilized in noise measurement techniques in order to shift downward the resolution limit of noise measurements as is represented, for example, in Chapter 9 of the book by Müller "Rauschen" ["Noise"], Springer Verlag, Berlin, 1990. However, a temporal averaging of statistical signals was always performed thereby.

BRIEF DESCRIPTION OF THE DRAWINGS

The present invention is explained in more detail below with the aid of the exemplary embodiment illustrated in the drawings, in which:

FIG. 1 shows a basic circuit arrangement for an amplifier according to the invention;

FIG. 2 shows a detailed illustration of the amplifier configuration according to the invention, with a frequency mixing option; and FIG. 3 shows an easily comparable corresponding amplifier configuration in accordance with the prior art.

DETAILED DESCRIPTION OF THE INVENTION

Through the distribution of the amplification over a plurality of parallel branches (see FIG. 1), the present invention uses a difference in the correlation of the physical noise of the various branches and the useful signal in order thus to shift downward the limit for useful signals that can still just be resolved. By contrast with the noise of the amplifier input stages, which is an uncorrelated variable in the various signal paths, the useful signal is a correlated variable in all signal paths. The invention now makes use of the fact that the squares of uncorrelated signals add up in a different manner to the squares of correlated signals. The effective amplitudes of the useful signals are mapped onto the output with a more favorable gain than the noise by means of the multiplication, following the amplification, or quadrature, which can also be combined if required with frequency mixing, of in each case two amplifier signals and their subsequent addition. Thus, even in the case of simple, non-redundant signal transmission, the result is an improvement in the signal/noise ratio at the output of the circuit. This ratio becomes even more favorable when a specific signal can be repeatedly transmitted and averaged.

Use is made in this invention of the correlation of signals which are to be processed in parallel (and therefore simultaneously). The averaging is restricted in this case exclusively to the interfering signals owing to the multiplication and the addition, carried out subsequently, of the parallel signals, since the correlated useful signals are added to one another.

The proposed architecture also opens up the possibility of combining noise suppression with the frequency mixing required in many instances. The location at which the formation of the sums (for the purpose of using the different correlation of the signals and the noise) is performed is arbitrary and can, in a fashion deviating from FIG. 1, not be performed until in the signal-processing digital part of a system, or after further mixing.

As illustrated in FIGS. 1 and 2, an amplifier circuit according to the invention comprises an input 10 at which the input signal $V_{in}$ arrives. According to the invention, this input signal is distributed over a plurality of amplifiers 20 . . . 29 whose output signals are fed in each case to a multiplier 30 . . . 39. Each of these multipliers 30 . . . 39 has two inputs, the respective other input being connected to the neighboring amplifier (29, 20 . . . 28). The outputs of the multipliers 30 . . . 39 are connected to a summing point 42 at which the corresponding output signals are summed. The output of this summing point simultaneously forms the output 40 of the amplifier circuit according to the invention at which the output signal $V_{out}$ is present.

The multipliers 30 . . . 39 can additionally be used simultaneously as frequency mixers, as is illustrated in FIG. 2. Here, the mixing frequency $f_{mix}$ is further optionally fed to each of the multipliers.

FIG. 3 shows a comparable amplifier circuit according to the prior art.

The mode of procedure of the invention is explained below in detail in conjunction with the theoretical mathematical principles:

When a plurality of amplifiers which amplify one and the same useful signal are used, the additional noise of these various amplifiers is (by contrast with the useful signal) not correlated.

Multiplying various amplified useful signals produces correlated squares of the amplified useful signals and uncorrelated squares of the noise signals of the individual amplifiers.

If these squares are added, it follows that, on the basis of the different properties, different sums of squares for uncorrelated and correlated noise signals result:

$$\sum_{i=1}^{n} v_{noise,i} \cdot v_{noise,i} = n \cdot v_{noise,mean}^2 \tag{1.a}$$

In this case, $v_{noise,i}$ is the noise of the amplifiers. The product of the noise of an amplifier with itself is a correlated signal. $v_{noise,mean}$ is the mean noise amplitude of a single amplifier. The products of the noise signals of the different amplifiers in FIG. 1 are uncorrelated, and the magnitude of the multiplication of these signals is therefore smaller than the correlated product of a noise signal with itself.

$$\sum_{i=1}^{n} v_{noise,i} \cdot v_{noise,i+1} \approx \sqrt{n} \cdot v_{noise,mean}^2 < n \cdot v_{noise,mean}^2 \tag{1.b}$$

The functional dependence of the uncorrelated products on the root of the number of the participating amplifiers n in (1.b) is an estimate. The product of the two variables from equation (1a) and (1b) is termed the correlation coefficient r:

$$r = \frac{\sum_{i=1}^{n} v_{noise,i} \cdot v_{noise,i+1}}{\sqrt{\sum_{i=1}^{n} v_{noise,i}^2 \cdot \sum_{j=1}^{n} v_{noise,j}^2}} \approx \frac{1}{\sqrt{n}} \tag{2}$$

For large n, the value 0 results for r in the case of uncorrelated variables according to I. N. Bronstein and K. A. Semendjajew, "Taschenbuch der Mathematik" ["Manual of Mathematics"], Verlag Harry Deutsch, Thun 1989, page 603. The product of completely uncorrelated variables therefore vanishes in the case of large n.

The input impedance of an amplifier determines the noise response of the amplifier in a similar way as the thermal noise determines the noise response of a resistor. It is given from the following equation (see H. Ott "noise reduction techniques in electronic systems", chapter 9, J. Wiley & Sons, New York, 1988):

$$\overline{v_{noise}^2} \sim R_{source} \text{ or } i_{noise}^2 \sim 1/R_{source} \tag{3}$$

Here, $v_{noise}$ is the voltage noise and $i_{noise}$ is the current noise of the amplifier.

Good low-noise amplifiers produce noise in accordance with the above-described law for the self-noise to the extent that they are operated at favorable operating points. Since the input impedance is prescribed in most systems, the dimensioning of the amplifier or the number of (unit) amplifiers connected in parallel is also prescribed. The implementation of a circuit in accordance with FIG. 1 therefore does not lead to any unnecessary consumption of area in the (relatively) high-impedance MOS system. The comparison carried out below is, however, virtually independent of the type and design of the amplifier as long as the latter has good noise properties.

If the resulting signal at the output in FIGS. 2 and 3 is calculated, the use of the parallel correlation principle (FIG. 2) produces better noise properties by comparison with the conventional approach:

$$\Delta v_{in,noise}^2 = \frac{v_{out,Fig.3}^2 - v_{out,Fig.2}^2}{a^2 \cdot n} = (1-r) \cdot v_{noise,mean}^2 \tag{4}$$

Here, $v_{in,noise}$ is the noise signal referred to the input. Identical electric properties have been assumed for the individual amplifiers. a is the gain of the individual amplifiers, and $a^2 n$ is that of the overall system. Since the input impedance of the overall system is mostly prescribed, the result is equation (4) or equation (3) irrespective of the selection of the amplifier configuration (for example n amplifiers with a gain of a, or one amplifier with a gain of $a\sqrt{n}$), as long as the overall gain is selected to be the same and all the amplifiers have ideal noise properties.

The improvement in the noise properties in FIG. 2 by comparison with FIG. 3 rises with the number n of amplifiers connected in parallel, since r becomes smaller on average in this case. It is possible here approximately to achieve an improvement proportional to the root of the individual amplifiers participating. In the same way, averaging of repeatedly transmitted signals also features in the improvement in the noise properties.

The invention claimed is:

1. A low-noise amplifier circuit having an input and an output, in the case of which the input is branched onto the inputs of at least two amplifiers arranged in parallel, and the outputs of these amplifiers are respectively connected to two multipliers whose respective other inputs are respectively connected to the output of another amplifier, and the outputs of the multipliers are led to a common summing point at whose output the output signal of the amplifier circuit is present.

2. The amplifier circuit as claimed in claim 1, in which the multipliers are designed simultaneously as frequency mixers.

3. A method for low-noise amplification of low-power signals, in which these signals are fed to the inputs of a plurality of amplifiers arranged in parallel, and the output signals of these amplifiers are multiplied by one another, wherein the output signals of the amplifiers are respectively multiplied by one another in pairs, and the results of the multiplications are then summed and the output signal is thus formed.

4. The method as claimed in claim 3, in which the multiplication is performed jointly with frequency mixing.

5. The method as claimed in claim 3, in which the signals are transmittal repeatedly and the mean value is formed from the repeatedly transmitted signals.

* * * * *

UNITED STATES PATENT AND TRADEMARK OFFICE
CERTIFICATE OF CORRECTION

PATENT NO. : 7,031,691 B2  
APPLICATION NO. : 10/181208  
DATED : April 18, 2006  
INVENTOR(S) : Ralf Brederlow Page 1 of 1

It is certified that error appears in the above-identified patent and that said Letters Patent is hereby corrected as shown below:

On the Title Page, Item (30) Foreign Application Priority Data, please delete "100 01 123" and add -- 100 01 123.3 --;

On the Title Page, Item (56) References Cited, please delete "3587915" and add -- 3567915 --;

Column 3, line 34 delete " $V_{noise,I}$ " and add -- $V_{noise, i}$ -- ;

Column 4, line 5 delete " $V_{noise}^2$ " and add -- $V^2 noise$ -- ;

Column 4, line 5 delete " $i_{noise}^2$ " and add -- $i^2 noise$ -- .

Signed and Sealed this

Seventh Day of August, 2007

JON W. DUDAS  
*Director of the United States Patent and Trademark Office*